(12) United States Patent
Levesque et al.

(10) Patent No.: US 7,026,553 B2
(45) Date of Patent: Apr. 11, 2006

(54) CABLE MANAGEMENT SYSTEM

(75) Inventors: Stewart A. Levesque, Scotland, CT (US); Lars R. Larsen, Old Lyme, CT (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 10/987,968

(22) Filed: Nov. 12, 2004

(65) Prior Publication Data
US 2005/0115737 A1 Jun. 2, 2005

Related U.S. Application Data

(62) Division of application No. 10/724,792, filed on Dec. 1, 2003, now Pat. No. 6,946,605.

(51) Int. Cl.
*H02G 3/00* (2006.01)
*A47F 7/00* (2006.01)

(52) U.S. Cl. .................. 174/100; 174/97; 211/26; 211/189; 248/49; 361/826

(58) Field of Classification Search .......... 174/48, 174/49, 50, 54, 60, 68.1, 68.3, 72 A, 97, 174/100, 101; 211/26, 189; 248/49, 68.1; 361/826, 827; 385/134, 135
See application file for complete search history.

(56) References Cited

U.S. PATENT DOCUMENTS

| | | | |
|---|---|---|---|
| 2,531,110 A | 11/1950 | Cisler | |
| 2,921,607 A | 1/1960 | Caveney | |
| 3,705,949 A | 12/1972 | Weiss | |
| 3,890,459 A | 6/1975 | Caveney | |
| 4,641,225 A | 2/1987 | Reichle | |
| 5,086,195 A | 2/1992 | Claisse | |
| 5,089,667 A | 2/1992 | Goussin et al. | |
| 5,531,410 A | 7/1996 | Simon | |
| 5,758,002 A | 5/1998 | Walters | |
| 5,806,811 A | 9/1998 | Viklund et al. | |
| 5,927,658 A | 7/1999 | Gerster | |
| 5,934,623 A | 8/1999 | Kopish | |
| 5,942,729 A | 8/1999 | Carlson, Jr. et al. | |
| 6,011,221 A | 1/2000 | Lecinski et al. | |
| 6,012,683 A | 1/2000 | Howell | |
| 6,023,024 A | 2/2000 | Stjerneby | |

(Continued)

OTHER PUBLICATIONS

PCT International Search Report dated May 10, 2005.

*Primary Examiner*—Dean A. Reichard
*Assistant Examiner*—Adolfo Nino
(74) *Attorney, Agent, or Firm*—McCarter & English, LLP

(57) ABSTRACT

A cable management system is provided that facilitates routing of cables from a rack, frame or cabinet. The cable management system may be mounted in a vertical or a horizontal orientation, and generally includes a wire cage assembly and at least one cable guide mounted to the wire cage assembly. The wire cage assembly is fabricated from vertical and horizontal wires, such that open regions are positioned for advantageous interaction with the disclosed cable guide. The cable guide generally includes an elongated member, a plurality of projection arms extending from the elongated member; and at least one L-shaped latching member extending from the elongated member. The cable guide advantageously mounts to the wire cage assembly through a latching mechanism that interacts with the back wall of the wire cage assembly. A method for mounting the cable guide(s) to the wire cage assembly is also provided.

18 Claims, 5 Drawing Sheets

U.S. PATENT DOCUMENTS

| | | |
|---|---|---|
| 6,215,069 B1 | 4/2001 | Martin et al. |
| 6,239,364 B1 | 5/2001 | Nickel |
| 6,242,698 B1 | 6/2001 | Baker et al. |
| 6,347,714 B1 | 2/2002 | Fournier et al. |
| 6,365,834 B1 | 4/2002 | Larsen et al. |
| 6,380,484 B1 | 4/2002 | Theis et al. |
| 6,468,112 B1 | 10/2002 | Follingstad et al. |
| 6,489,565 B1 | 12/2002 | Krietzman et al. |
| 6,570,092 B1 * | 5/2003 | Quertelet ................... 174/68.3 |
| 6,590,154 B1 | 7/2003 | Badey et al. |
| 6,590,785 B1 | 7/2003 | Lima et al. |
| 6,600,106 B1 | 7/2003 | Standish et al. |
| 6,637,704 B1 * | 10/2003 | Jette ........................... 248/49 |
| 6,677,520 B1 | 1/2004 | Kim et al. |
| 6,708,830 B1 | 3/2004 | Mendoza |
| 6,855,884 B1 * | 2/2005 | Spagnoli et al. .............. 174/48 |

* cited by examiner

CABLE MANAGEMENT SYSTEM

CROSS REFERENCE TO RELATED APPLICATION(S)

This application is a divisional of U.S. Ser. No. 10/724,792 filed Dec. 1, 2003, now U.S. Pat. No. 6,946,605 issued Sep. 20, 2005.

BACKGROUND OF THE DISCLOSURE

1. Technical Field

The present disclosure is directed to a cable management system that facilitates routing of cables and, more particularly, to a cable management system that is adapted for vertical and/or horizontal applications and that includes a wire cage assembly and one or more cable guides mounted thereto for routing cables/wires to and from equipment that is stored on or in rack(s), frame(s) and/or cabinet(s).

2. Background

It is common to store computers, servers and other electronic equipment on or in racks, frames and cabinets. Numerous cables and wires are routinely required to power and interconnect these units, as is well known in the art. Efficient, reliable and organized routing of cables and wires to and from such equipment is highly desirable, but not easily achieved.

Prior art efforts have been devoted to developing raceways for routing cables and wires to and from equipment mounted/stored on/in racks, frames and cabinets. Prior art raceways generally permit cables/wires to be routed vertically to equipment mounted/stored on/in racks, frames and cabinets. The routed cables/wires may enter the raceway from a variety of locations, e.g., from other equipment on the rack/frame/cabinet, from an overhead raceway, and/or from an underfloor raceway. With conventional vertical raceways, cables/wires are generally routed vertically to a desired height, and then horizontally to an interconnection position relative to the desired equipment unit.

Exemplary prior art teachings that relate to the field of cable management are U.S. Pat. No. 2,921,607 to Caveney, U.S. Pat. No. 3,705,949 to Weiss, and U.S. Pat. No. 6,489,565 to Krietzman et al. Cable management products/systems are commercially available from numerous manufacturers, including Ortronics, Inc. (New London, Conn.), Panduit Corporation (Tinley Park, Ill.) and Chatsworth Products, Inc. (Westlake Village, Calif.).

Despite prior art efforts to date, a need remains for a vertical cable management system that may be easily and securely mounted with respect to a rack/frame/cabinet includes a wire cage assembly and one or more cable guides mounted thereto for routing cables/wires to and from equipment that is stored on rack(s).

SUMMARY OF THE DISCLOSURE

According to the present disclosure, an advantageous cable management system for use in vertical and/or horizontal applications is disclosed that includes a wire cage assembly and one or more cable guides that are mountable relative to the wire cage assembly. The wire cage assembly is generally U-shaped, including a back wall and two relatively short side walls. The back wall and the side walls are generally substantially open based on the wire construction thereof. Spaced wires, typically in substantially perpendicular vertical and horizontal orientations, define the back and side walls of the U-shaped wire cage assembly. At the top and bottom of the wire cage assembly (when viewed in a vertical orientation), forwardly extending wire arms may be provided to facilitate mounting of a door assembly, e.g., the advantageous door assembly described in a commonly assigned patent application entitled "Rack-Mounted Door Assembly," that is being filed contemporaneously herewith. The entire contents of the "Rack-Mounted Door Assembly" patent application is incorporated herein by reference. A base member may also be mounted with respect to the wire cage assembly, particularly in vertical applications, e.g., in cooperation with the forwardly extending arms at the bottom of the wire cage assembly, to interact with the door assembly and/or to further stabilize the wire cage assembly in situ.

When viewed in its vertical orientation, the relatively short side walls of the wire cage assembly typically define at least one vertically aligned set of "open" regions. In addition, at least a portion of each of the corner regions of the disclosed wire cage assembly, i.e., the regions where the side walls transition into the back wall, are typically "open" regions. Thus, based on the geometry and alignment of the vertical and horizontal wires that form the wire cage assembly of the present disclosure, a series of vertically aligned, spaced-apart open regions are defined in each of the side walls and in each of the corner regions of the wire cage assembly.

The advantageous cable guide of the present disclosure includes an elongated elongated member that supports rearwardly extending latching member(s) and forwardly extending projecting arms. The elongated member generally includes a plurality of alignment channels for interacting/aligning with the wire cage assembly. In an exemplary embodiment of the present disclosure, the elongated member includes an elongated alignment channel for interacting/aligning with a vertical wire of the side wall (when viewed in its vertical orientation) and a plurality of spaced-apart horizontal channels for interacting/aligning with horizontal wires of the side wall.

Advantageous L-shaped latching member(s) according to the present disclosure include: (i) an alignment channel that may be vertically oriented, e.g., when interacting with a vertically oriented overall structure, (ii) a latching finger structure, and (iii) cut-out region(s) to facilitate flexure of the L-shaped latching member during engagement with the wire cage assembly. The L-shaped latching member is advantageously sized and configured to fit between adjacent horizontal wires. The L-shaped latching member is further sized and configured to latch between two adjacent vertical wires of the wire cage assembly, i.e., the rearward-most vertical wire of the side wall and the outer-most vertical wire of the back wall. Thus, when the L-shaped latching member is mounted with respect to the wire cage assembly, the L-shaped latching member is substantially positioned in the corner region of the wire cage assembly.

A plurality of spaced projecting arms extend from the elongated member in the forward direction, i.e., away from the back wall. The spaced projecting arms are generally horizontal in alignment and include a transverse element at a distal end thereof. The transverse elements for respective projecting arms are generally dimensioned such that a clearance is defined between adjacent transverse elements. In an exemplary embodiment of the present disclosure, the outwardly directed faces of the transverse elements define angled lead-in surfaces to guide cables/wires to pass through the clearance space defined between adjacent transverse elements. The projecting arms are typically fabricated from a material that exhibits some flexural capacity, such that the clearance between adjacent projecting arms can be increased to better accommodate introduction/withdrawal of cables/wires. The projecting arms are advantageously spaced by a distance equal to one rack unit, and cable ring regions are defined between adjacent projecting arms to facilitate cable/wire management activities, as will be readily apparent to persons skilled in the art.

In use and with reference to a vertical orientation of the wire cage assembly, a cable guide according to the present disclosure is advantageously mounted to a wire cage assembly by angularly introducing the L-shaped latching member(s) through the space defined between the two rearwardmost vertical wires of the side wall. The L-shaped latching members are introduced from the outside of the wire cage assembly such that the spaced horizontal channels of the upright member align with the horizontal wire segments between the adjacent vertical wires. The cable guide is then pivoted or rotated such that the projecting arms move toward alignment with the side walls. As the cable guide is pivoted/rotated, the elongated alignment channel of the elongated member receives the forward vertical wire of the side wall and the alignment channel(s) of the L-shaped latching member(s) receive the rear-most vertical wire of the side wall. Final latching of the cable guide to the wire cage assembly is achieved by bringing the latching finger structure(s) of the L-shaped latching member(s) into engagement with the outer-most vertical wire of the back wall. Flexure of the L-shaped latching member(s) is generally required to engage the latching finger structure(s) with the vertical wire of the back wall.

Multiple cable guides may be mounted to the wire cage assembly, e.g., in side-by-side arrangement and/or in combination with opposite side walls of the wire cage assembly, to provide a desired cable management length/height. Moreover, a door or other facing structure may be mounted across the front of the wire cage assembly, to further isolate and protect the cables/wires positioned within the cable management region.

The subassembly formed by combining the disclosed wire cage assembly with the disclosed cable guide(s) may be advantageously mounted relative to conventional rack, frame and/or cabinet assemblies in either a horizontal or vertical orientation. According to exemplary embodiments of the present disclosure, mounting apertures may be formed in the elongated upright channel to facilitate side mounting of the wire cage/cable guide subassembly and/or mounting apertures may be formed in L-shaped latching member(s), e.g., adjacent the latching finger structure(s), to facilitate mounting of the subassembly to the front face of a rack, frame and/or cabinet assembly. Horizontal mounting of the disclosed subassembly may be achieved relative to one or more racks, thereby defining a horizontal cable manager that allows cables/wires to be routed across the face of the rack(s).

Additional advantageous features and functions associated with the disclosed wire cage assembly and cable guide will be apparent from the detailed description which follows, particularly when reviewed together with the appended figures.

BRIEF DESCRIPTION OF THE FIGURES

To assist those of ordinary skill in the art to which the subject matter of the present disclosure appertains to better understand how to make and use the cable management systems of the present disclosure, reference is made to the accompanying figures, wherein.

DETAILED DESCRIPTION OF EXEMPLARY EMBODIMENT(S)

The advantageous cable management system of the present disclosure may be employed as a vertical cable manager and/or a horizontal cable manager, and generally includes a wire cage assembly to which one or more cable guides are advantageously mounted. The wire cage assembly is fabricated from a plurality of substantially perpendicular vertical and horizontal wires that are secured with respect to each other in a conventional manner, e.g., by welding or other conventional joining technique. The wire cage assembly is generally U-shaped and includes a back wall and two relatively short side walls. The back wall and the side walls are generally substantially open based on the wire construction thereof. According to the present disclosure, one or more cable guides may be mounted with respect to the wire cage assembly to facilitate advantageous cable/wire routing and management.

In the accompanying figures, the wire cage assembly and racks are depicted in a vertical orientation. However, it is to be understood that these depictions are merely illustrative in nature, and that the disclosed wire cage assembly/cable guides are not limited to use in vertical cable management applications. Rather, the disclosed wire cage assembly/cable guides may be used in horizontal cable management applications, e.g., by horizontal mounting of such subassembly with respect to one or more racks so as to route cables/wires horizontally (e.g., across the front of the rack(s)).

Figure 1:
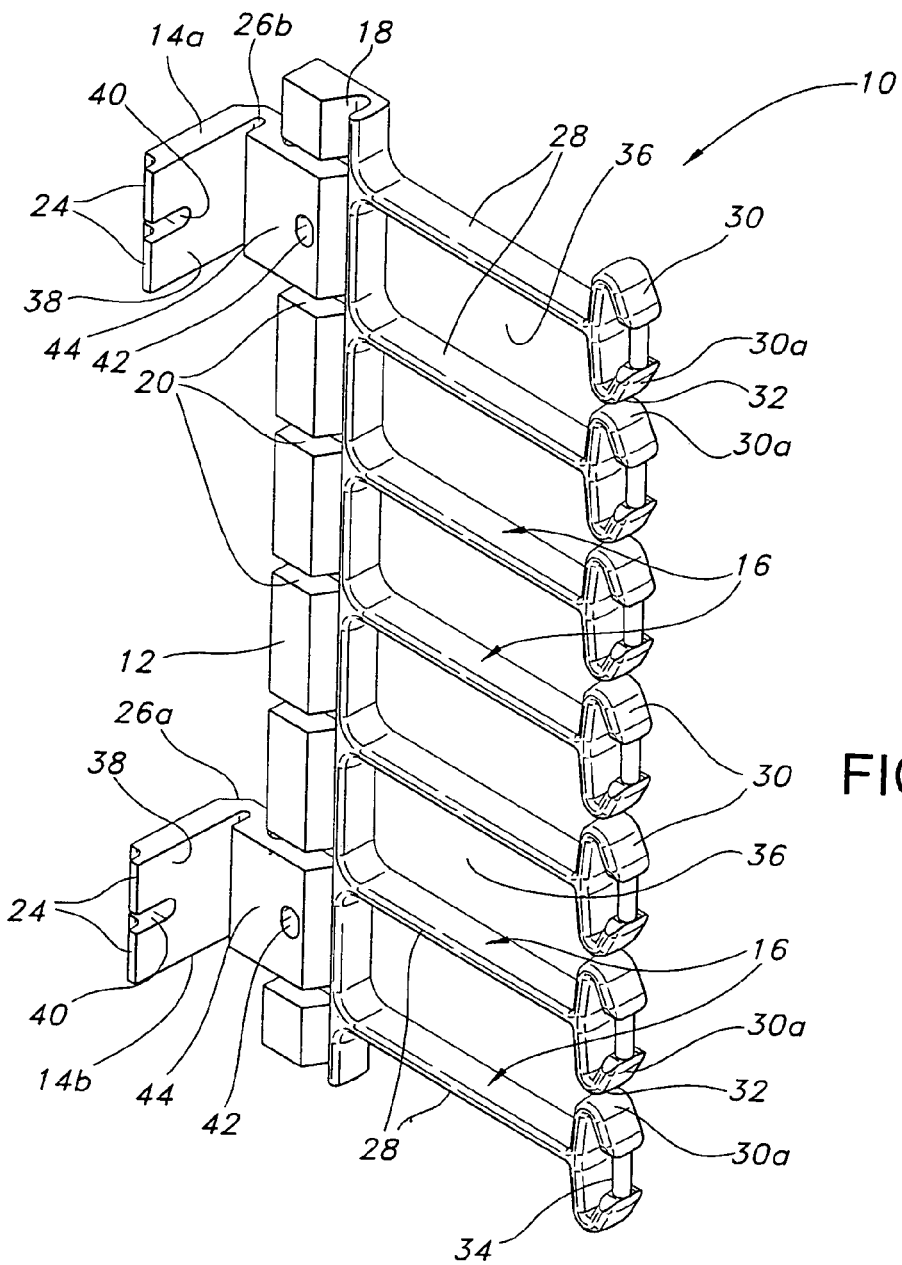
FIG. 1 is a perspective plan view of an exemplary cable guide according to the present disclosure.
Figure 2:
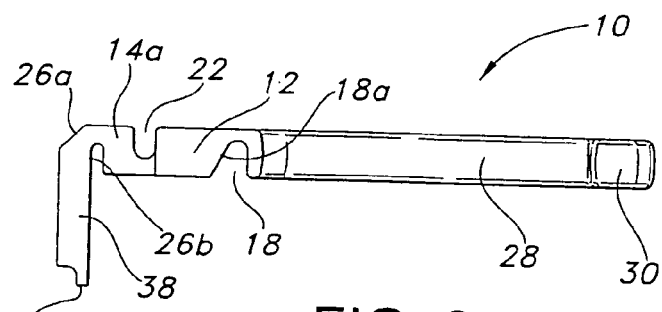
FIG. 2 is a top view of the exemplary cable guide of FIG. 1.

Thus, with initial reference to FIGS. 1 and 2, an exemplary cable guide 10 according to the present disclosure is depicted. Cable guide 10 includes an elongated member 12 that supports two rearwardly extending latching members 14a, 14b and a plurality of forwardly extending projecting arms 16. The elongated member 12 generally includes a plurality of alignment channels for interacting/aligning with the wire cage assembly. In an exemplary embodiment of the present disclosure, elongated member 12 includes an elongated alignment channel 18 for interacting/aligning with a vertical wire of the side wall and a plurality of spaced horizontal channels 20 for interacting/aligning with horizontal wires of the side wall.

Advantageous L-shaped latching member(s) 14a, 14b according to the present disclosure include: (i) an alignment channel 22 (vertically oriented in the exemplary embodiment of FIGS. 1–2), (ii) a latching finger structure 24, and (iii) cut-out region(s) 26a, 26b to facilitate flexure of the L-shaped latching member 14a, 14b during engagement with the wire cage assembly. Each L-shaped latching member 14 is advantageously sized and configured to fit between adjacent horizontal wires of the wire cage assembly. Each L-shaped latching member 14 is further sized and configured to latch between two adjacent vertical wires of the wire cage assembly, i.e., the rearward-most vertical wire of the side wall and the outer-most vertical wire of the back wall. Thus, when the L-shaped latching members 14a, 14b are mounted with respect to the wire cage assembly, the L-shaped latching members 14 are substantially positioned in the corner region of the wire cage assembly.

A plurality of spaced projecting arms 16 extend from the elongated member 12 in the forward direction, i.e., away from the back wall of the wire cage assembly (when mounted with respect thereto). The spaced projecting arms 16 are generally in horizontal alignment and include a truss 28 and a transverse element 30 at a distal end of truss 28. The transverse elements 30 for respective projecting arms 16 are generally dimensioned such that a clearance 32 is defined between adjacent transverse elements 30. In an exemplary embodiment of the present disclosure, the outwardly directed faces of the transverse elements define angled lead-in surfaces 30a to guide cables/wires (not pictured) to pass through the clearance space 32 defined between adjacent transverse elements 30.

In an exemplary embodiment of the present disclosure, transverse elements 30 define a substantially trapezoidal bounded region 34, the base of which cooperates with an adjacent base and confronting trusses 28 to define a cable ring region 36 for cables/wires entering or exiting laterally. The spacing between confronting trusses 28 generally corresponds to a conventional rack unit height, thereby facilitating cable/wire management operations, as is known to persons skilled in the art. The overall length of truss 28 is generally selected to provide the desired cable ring region 36, while ensuring that the forward extension of cable guide 10 does not exceed applicable size constraints, e.g., based on conventional rack/cabinet space allotments. The thickness/width of truss 28 and its material of construction are advantageously selected to provide a level of strength so as to ensure that a desired quantity of cables/wires may be supported thereon, while permitting limited flexure of trusses 28 for introduction of cables/wires through clearance space 32. Thus, the projecting arms are typically fabricated from a material that exhibits an appropriate level of flexural capacity, e.g., a polycarbonate (Lexan® polycarbonate, GE Plastics), acrylonitrile butadiene styrene (ABS), an ABS/polycarbonate material (Cycoloy™ material, GE Plastics), a glass-filled polycarbonate (e.g., 10% glass filled polycarbonate), and the like.

With further reference to L-shaped latching members 14a, 14b, latching finger structure 24 is formed in a back plate 38. As best seen in FIG. 2, finger structure 24 generally defines an arcuate or radiused region of reduced thickness formed in back plate 38. The radius of curvature of such arcuate region is generally dimensioned to cooperate with the outer radius of the vertical wires of the wire cage assembly to which cable guide 10 is to be mounted. Thus, for example, the thickness of back plate 38 may be on the order of 0.25 to 0.30 inches, and the depth and width of the cut-out region formed in the back plate 38 to define finger structure 24 may be about 0.15 to 0.20 inches. Thus, for a wire cage assembly constructed with wires having a diameter of between about 0.15–0.20 inches, the cut-out regions substantially embraces/captures such vertical wires, as discussed in greater detail below.

A slot 40 is advantageously defined in back plate 38 to facilitate mounting of a wire cage/cable guide subassembly to the front face of a rack/frame/cabinet, e.g., with a screw or other attachment mechanism, as is known in the art. Slot 40 defines a fully bounded aperture once cable guide 10 is mounted with respect to a wire cage assembly, as discussed in greater detail below. Similarly, an aperture 42 is advantageously formed in side face 44 of L-shaped latching member 14 to facilitate side mounting of a wire cage/cable guide subassembly to the side face of a rack/frame/cabinet, e.g., with a screw or other suitable attachment mechanism.

Figure 3:
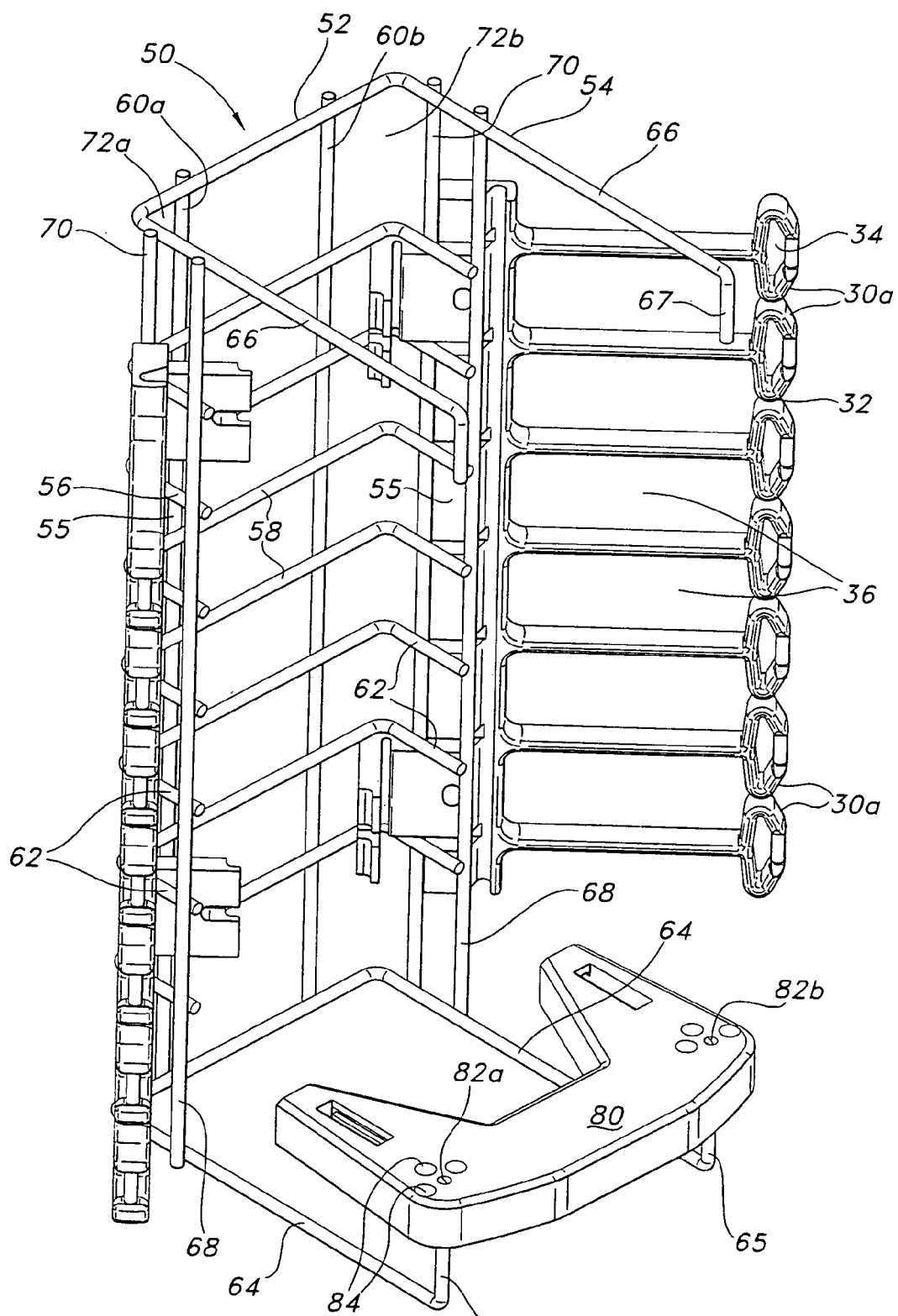
FIG. 3 is a perspective plan view of an exemplary wire cage assembly in a vertical orientation to which is being mounted a pair of cable guides and a base member, according to one aspect of the present disclosure.
Figure 4:
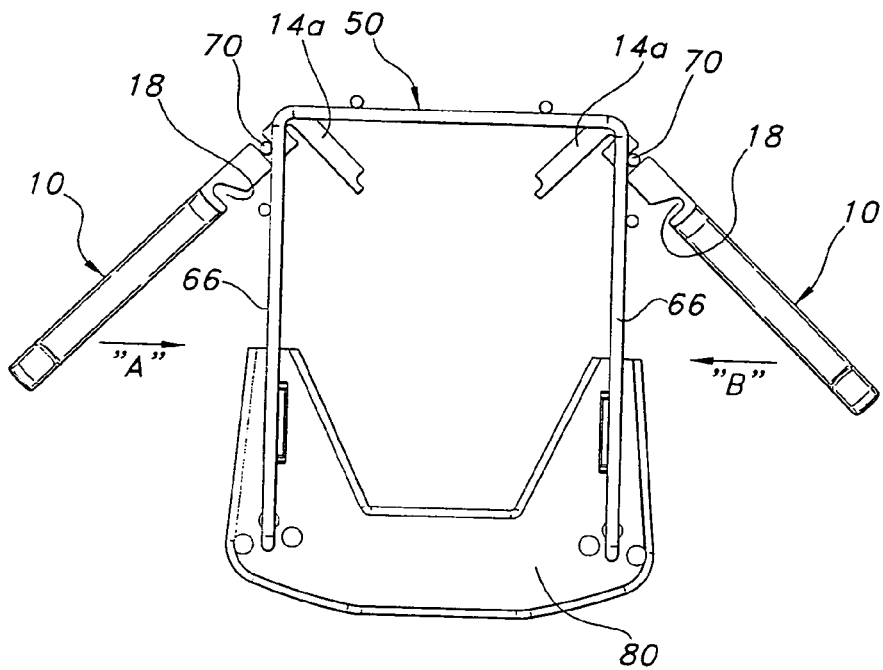
FIG. 4 is a top view of the wire cage assembly, cable guides and base member of FIG. 3.

With reference to FIGS. 3 and 4, an exemplary wire cage assembly 50 for use in association with the disclosed cable guide 10 is now described. Wire cage assembly 50 is shown in a vertical orientation and generally includes and is defined by a plurality of spaced-apart wires, typically in vertical and horizontal orientations, i.e. substantially perpendicular to each other. With particular reference to FIG. 3, wire cage assembly 50 includes a back wall 52 and side walls 54, 56. Back wall 52 is defined by a plurality of substantially horizontal wire segments 58 and two vertical wires 60a, 60b. Wire segments 58 are joined with respect to vertical wires 60a, 60b at their respective crossing points by welding, although alternative means of attachment may be employed as may be desired in fabricating a wire cage assembly according to the present disclosure. Horizontal wire segments 58 are typically spaced by a distance equal to a single rack mounting unit (RMU), i.e., a distance of approximately 1.75 inches.

In the vertical orientation of the appended figures, side walls 54, 56 are each defined by a bottom wire segment 64, a top wire segment 66, and intermediate wire segments 62. Each of the wire segments 62, 64, 66 defining side walls 54, 56 is substantially horizontal and is advantageously spaced by a distance equal to a single RMU. Vertical wires 68 define a front edge of side walls 54, 56, and are typically joined to the horizontal wire segments 62, 64, 66, e.g., by welding or the like. Side walls 54, 56 are further defined by a second vertical wire 70 that is rearwardly positioned relative to vertical wire 68. Of note, vertical wires 68, 70 (which form part of side walls 54, 56) and vertical wires 60a, 60b (which form part of back wall 52) are spaced away from the bend regions of horizontal wire segments 62, 64, 66 and wire segments 58, such that corner regions 72a, 72b are devoid of vertical wires/vertical wire segments. In exemplary embodiments of the present application, the wire segments 62, 64, 66 (of side walls 54, 56) and wire segments 58 (of back wall 52) are continuous wire elements, with 90° bend regions to define the transition from side walls 54, 56 to back wall 52. The 90° bend regions are typically radiused, e.g., in view of conventional manufacturing limitations, as will be apparent to persons skilled in the art.

Figure 5:
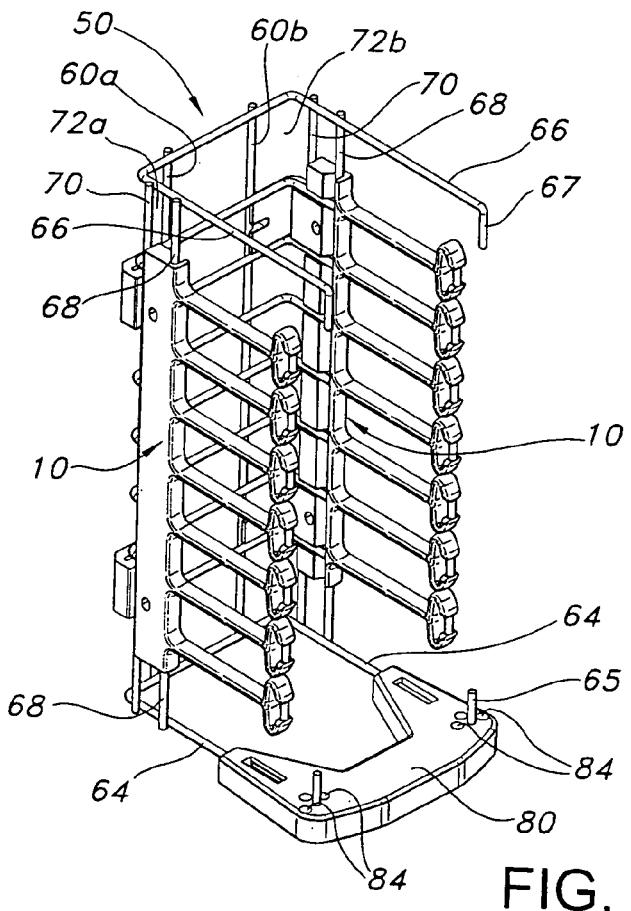
FIG. 5 is a perspective plan view of the assembled wire cage assembly, cable guides and base member in a vertical orientation, as previously shown in FIGS. 3 and 4.
Figure 6:
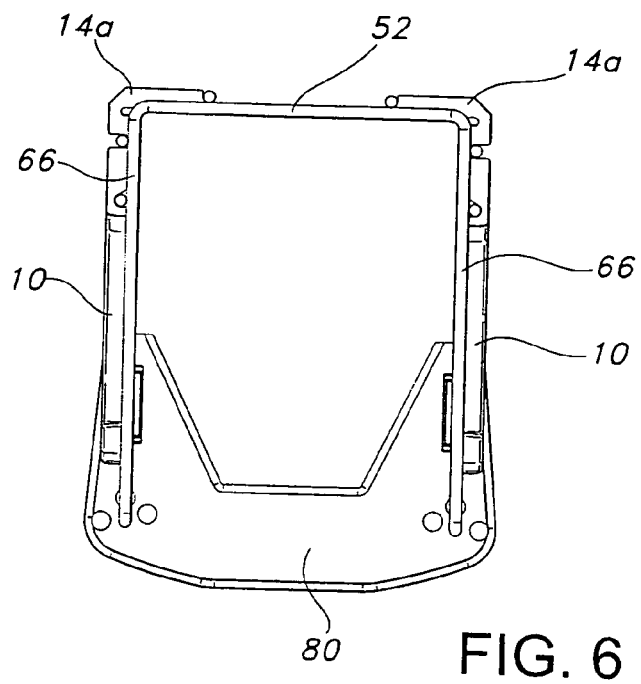
FIG. 6 is a top view of the assembled configuration of FIG. 5.
Figure 7:
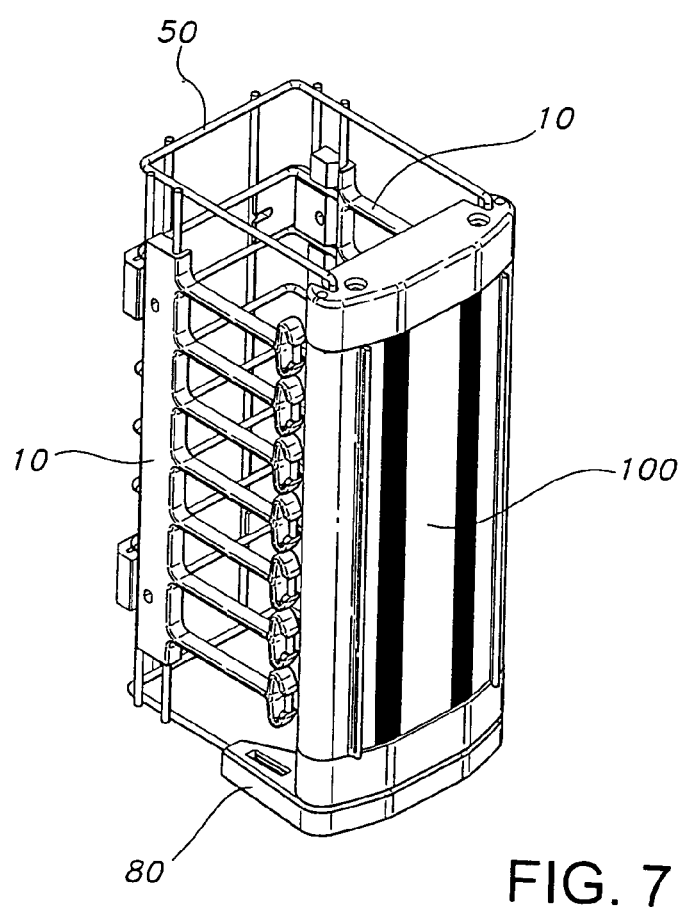
FIG. 7 is a perspective plan view of the assembly of FIG. 5 in a vertical orientation, with an exemplary door member mounted to the front thereof.

Thus, the horizontal wires associated with wire cage assembly 50 define substantially U-shaped wires, as depicted in FIGS. 3, 5 and 7. In alternative embodiments of the present disclosure, however, the horizontal wire segments may be defined by distinct wire elements that are joined, e.g., through corner brackets or the like, to define substantially U-shaped, horizontal wire elements. Bottom wire segment 64 and top wire segment 66 advantageously extend beyond vertical wires 68 in connection with side walls 54, 56. With reference to top wire segment 66, downward projections 67 are typically defined at forward locations thereof. Similarly, with reference to bottom wire segment 64, upward projections 65 are typically defined at forward locations thereof. Downward projections 67 and upward projections 65 are typically formed through 90° radiused bends of top wire segment 66 and bottom wire segment 64, respectively.

With further reference to FIGS. 3 and 5, a base member 80 is advantageously associated with wire cage assembly 50. Base member 80 may be molded from a suitable polymeric material, e.g., a polycarbonate or the like. Base member 80 advantageously defines a pair of apertures 82a, 82b for receiving upward projections 65. Alignment slots (not pictured) may be molded into the underside of base member 80 to receive bottom wire segments 64. In addition, a deflectable arm (not pictured) may advantageously extend into one or both alignment slots, such deflectable arm(s) permitting the bottom wire segment 64 to enter the alignment slot, but preventing the withdrawal therefrom (unless the deflectable arm is deflected out of engagement therewith). Base member 80 serves as a stabilizing structure for wire cage assembly 50 and, in exemplary embodiments of the present disclosure, includes a plurality of indentations 84 for interacting with a downward projection from a door member 100 (see FIG. 7). Interaction between indentations 84 and the downward projection(s) associated with door member 100 serve to temporarily fix the position of door member 100 relative to wire cage assembly 50 and base member 80. Further structural and functional aspects of an advantageous door member for use with the wire cage assembly/cable guide(s) of the present disclosure is set forth in a commonly assigned and contemporaneously filed patent application entitled "Rack-Mounted Door Asssembly," Ser. No. 10/724,788, the entire contents of which are hereby incorporated herein by reference.

Side walls 54, 56 of wire cage assembly 50 typically define at least one vertically aligned set of "open" regions 55. Open regions 55 are defined by vertical wires 68, 70 and opposed horizontal wire segments 62. Thus, open regions 55 are typically substantially rectangular in geometry with a height that is slightly less than the height of a typical RMU (due to the thickness of the opposed horizontal wire segments). In exemplary embodiments of the present disclosure, the open regions defined in part by bottom wire segment 64 and by top wire segment 66 may exhibit an alternative height, e.g., a height that is not closely correlated to the height of a typical RMU. Open regions 55 defined in side walls 54, 56 are horizontally aligned with open corner regions 72a, 72b. Thus, based on the geometry and alignment of the vertical and horizontal wires that form wire cage assembly 50, a series of vertically aligned, spaced open regions are defined in each of the side walls and in each of the corner regions of the wire cage assembly.

In use, one or more advantageous cable guides 10 according to the present disclosure are advantageously detachably mounted to a wire cage assembly 50, thereby defining a vertical or horizontal cable/wire raceway that communicates with cable ring regions for transversely routing cables/wires. With reference to FIGS. 3 and 4, the manner in which exemplary cable guide(s) 10 are mounted to a wire cage assembly 50 according to the present disclosure is further described. For mounting purposes, L-shaped latching members 14a, 14b associated with a cable guide 10 are introduced through open regions 55 defined in side wall 54 or 56. To facilitate such introduction, cable guide 10 is angularly oriented with respect to wire cage assembly 10, with L-shaped latching members 14a, 14b aligned with respective open regions 55. In fabricating cable guide 10, the spacing of L-shaped latching members 14a, 14b is typically defined by a preset number of RMUs, e.g., five RMUs in the exemplary embodiment depicted in FIG. 3. Moreover, the L-shaped latching members 14a, 14b are typically formed at or near opposite ends of cable guide 10, thereby providing enhanced stability when cable guide 10 is mounted with respect to wire cage assembly 50.

Once introduced into an open region 55, cable guide 10 is oriented such that vertical wire 70 is received in the alignment channels 22 of the spaced L-shaped latching members 14a, 14b. Cable guide 10 is then rotated relative to vertical wire 70, such that vertical wire 68 is received in elongated alignment channel 18 and latching finger structure 24 comes into engagement with vertical wire 60a or 60b (in back wall 52). As cable guide. 10 is rotated into position, horizontal wire segments 62 are received in spaced horizontal channels 20. Of note, one or more of the foregoing channels may be provided with angled lead-in surfaces, to facilitate receipt/alignment of the corresponding vertical/horizontal wires of wire cage assembly 50 therewith. Thus, for example, elongated alignment channel 18 is advantageously provided with an angled lead-in surface 18a, as shown in FIG. 2, to facilitate alignment/introduction of vertical wire 68 therewithin.

Final latching of cable guide 10 relative to wire cage assembly 50 is achieved by bringing the latching finger structures 24 of the L-shaped latching members 14a, 14b into engagement with the outer-most vertical wire, i.e., vertical wire 60a, 60b, of back wall 52. Latching finger structures 24 engage vertical wire 60a, 60b, of back wall 52. Latching finger structures 24 engage vertical wire 60a, 60b, typically through flexure of L-shaped latching members 14a, 14b, e.g., flexure relative to cut-out regions 26a and/or 26b. Thus, as shown in FIG. 5, cable guide 10 is brought into engagement with wire cage assembly 50, such that projecting arms 16 are substantially aligned with wire elements 62, 64, 66 and back plates 38 are substantially aligned with back wall 52 of wire cage assembly 50. The body of L-shaped latching member 14a, 14b is positioned in the open corner regions 72a, 72b of wire cage assembly 50. Of note, latching of cable guide(s) 10 relative to wire cage assembly 50 is achieved at the rear of wire cage assembly 50, i.e., through interaction between latching finger structure 24 and vertical wire(s) 60a, 60b. The other physical interactions between cable guide(s) 10 and wire cage assembly 50 merely function to facilitate alignment of cable guide(s) 10 relative to wire cage assembly 50, and to impart enhanced stability to the overall subassembly.

Multiple cable guides 10 may be mounted to wire cage assembly 50, e.g., in side-by-side arrangement and/or in combination with opposite side walls of the wire cage assembly, to provide a desired cable management length/height. Thus, as shown in FIGS. 3, 5 and 7, a cable guide 10 is mounted to each side of wire cage assembly 50. According to exemplary embodiments of the present application, the rack to which the wire cage assembly/cable guide subassembly is mounted is on the order of seven feet (7') in height. In such circumstance and in defining a vertical cable management system, a plurality of cable guides 10 may be mounted on each side of the wire cage assembly, e.g., six (6) cable guides may be mounted on each side of the wire cage assembly (12 cable guides are mounted to the wire cage assembly, in total), so as to provide an advantageous vertical raceway that cooperates with the total rack height.

Of note, cable guide 10 is advantageously symmetric in design, such that inversion of cable guide 10 does not affect the functionality associated therewith. Thus, with reference to FIGS. 3–6, the cable guides 10 mounted to opposite sides of wire cage assembly 50 are identical units. With particular reference to FIG. 4, arrow "A" at the left of wire cage assembly 50 shows that the left-mounting cable guide 10 rotates counter-clockwise relative to the associated vertical wire 70, whereas arrow "B" at the right of wire cage assembly shows that the right-mounting cable guide 10 rotates clockwise relative to the associated vertical wire 70. This symmetry associated with cable guide 10 further enhances the functionality and cost-effectiveness of the cable management system of the present disclosure.

With further reference to FIG. 7, exemplary door member 100 is mounted with respect to wire cage assembly 50 in a "closed" orientation. In embodiments where it is desired to enclose the front face of the raceway defined by wire cage assembly 50 and cable guide(s) 10, a door member may be advantageously employed. Alternative structures, e.g., alternative door elements beyond door member 100, may be employed in conjunction with the subassembly of wire cage assembly and cable guides 10 to further isolate and protect the cables/wires positioned within the cable management region, as will be readily apparent to persons skilled in the art.

Figure 8:
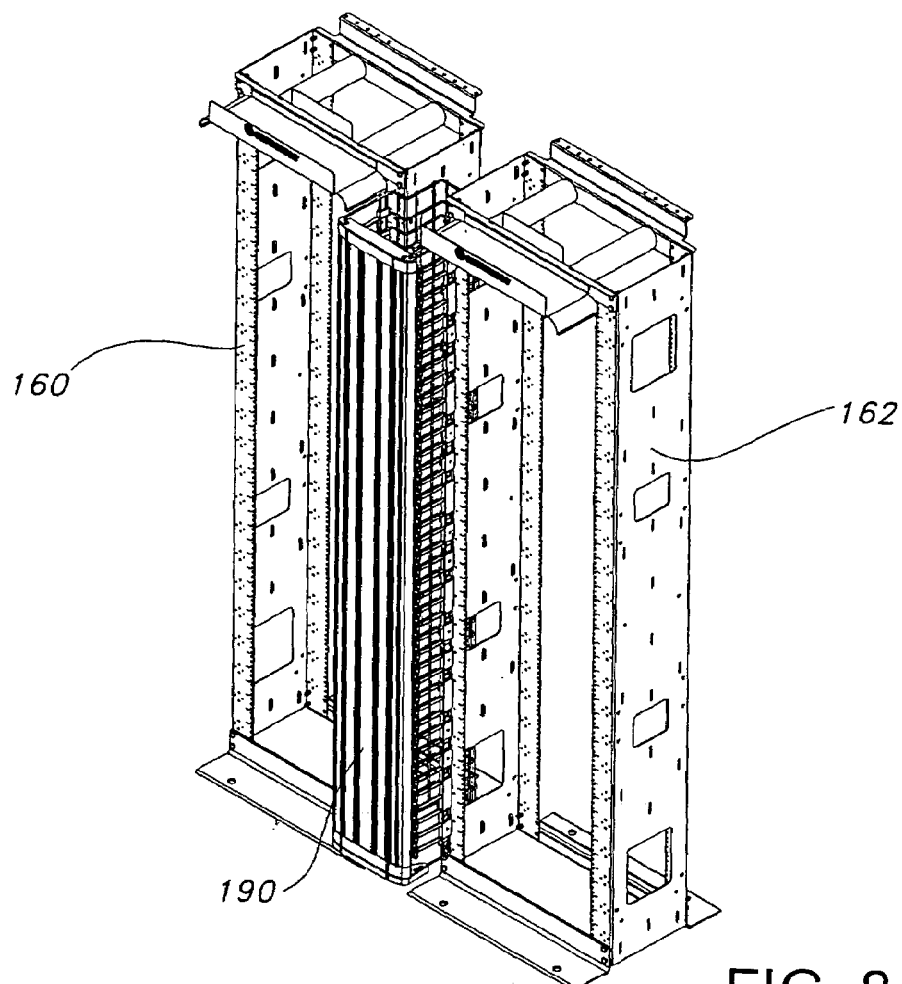
FIG. 8 is a perspective plan view of two racks with a wire cage assembly, a plurality of wire guides and a door mounted with respect thereto.
Figure 9:
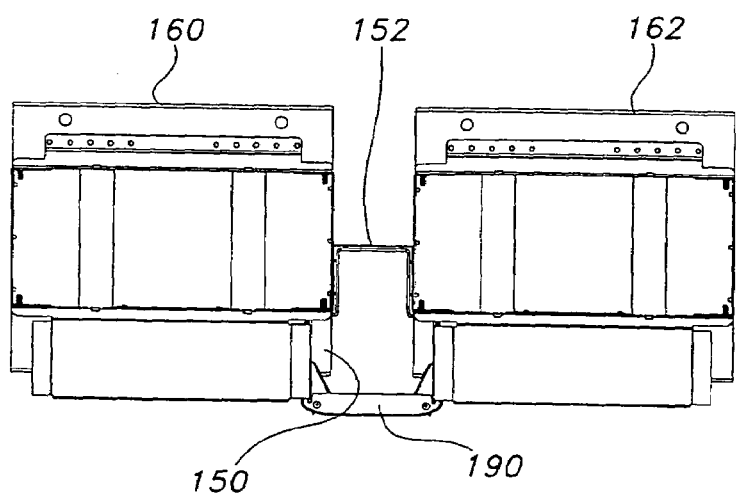
FIG. 9 is a top view of the overall assembly of FIG. 8.

The subassembly formed by combining the disclosed wire cage assembly with the disclosed cable guide(s) may be advantageously mounted to conventional rack, frame and/or cabinet assemblies, i.e., to define vertical and/or horizontal cable management systems. Thus, as shown in FIGS. 8 and 9, wire cage assembly 150 is vertically mounted with respect to first rack 160 and second rack 162. Wire cage assembly 150 differs from wire cage assembly 50 discussed above in that a U-shaped extension region 152 is defined in the rear wall thereof. The U-shaped extension region is dimensioned and configured to fit between adjacent racks 160, 162 in the manner depicted in FIG. 9. First and second racks 160, 162 are of conventional design and are merely illustrative of the types of racks to which the wire cage assembly/cable guide(s) of the present disclosure may be mounted.

A plurality of cable guides are mounted to wire cage assembly 150, and the apertures/slots formed in the elongated member and/or the L-shaped latching members are employed in mounting the wire cage assembly/cable guides subassembly to racks 160, 162. An elongated door member 190 is also mounted with respect to wire cage assembly 150 in the manner discussed with reference to door member 100 above. Once mounted to racks 160, 162, the wire cage assembly/cable guides subassembly provides an advantageous cable management system for routing of cables/wires relative to equipment positioned on/in racks 160, 162, whether in a horizontal or a vertical orientation.

Although advantageous cable management systems according to the present disclosure (including advantageous wire cage assemblies, cable guides, associated sub-assemblies and methods for use) have been described with reference to exemplary embodiments thereof, it is to be understood that the present disclosure is not limited to the specifically disclosed embodiments. Rather, the exemplary embodiments described herein are merely illustrative of implementations of the disclosed cable management systems and methods for use thereof. The present disclosure specifically encompasses alternative and/or modified embodiments of the disclosed cable management systems, as set forth in the accompanying claims hereto.

The invention claimed is:

1. A substantially U-shaped wire cage assembly, comprising:
    (a) a back wall defined by at least two vertical wires and a plurality of horizontal wire segments; and
    (b) two side walls joined to said back wall to define a U-shaped configuration, each of said side walls being defined by at least two vertical wires and a plurality of intermediate horizontal wire members, said plurality of horizontal wire members including a top wire member, a bottom wire member, and a plurality of intermediate wire segments, each of said top wire member and said bottom wire member being longer than said plurality of intermediate wire segments,
    wherein said U-shaped configuration defines first and second corner regions, and wherein said first and second corner regions are devoid of vertical wires.

2. The wire cage assembly according to claim 1, wherein said top wire member defines a downward projection at a forward end thereof, and said bottom wire member defines an upward projection at a forward end thereof, said downward projection and said upward projection being adapted to interact with a door member.

3. The wire cage assembly according to claim 1, further comprising a base member associated with said bottom wire member.

4. A wire cage, comprising:
    a first side and a second side, each side being defined by at least two vertical wires and a number of horizontal wires, said horizontal wires including an upper wire, a lower wire, and one or more intermediate wires, wherein said top wire and said bottom wire are longer relative to said one or more intermediate wires,
    wherein a number of first open regions located at a first interface defined by said first side and said second side are defined, in part, by a first vertical wire of said first side and a first vertical wire of said second side, said first vertical wire of said first side being spaced a first distance from said first interface and said first vertical wire of said second side being spaced a second distance from said first interface, said second distance being different from said first distance.

5. The wire cage of claim 4, wherein said first side is wider relative to said second side.

6. The wire cage of claim 5, further comprising a third side substantially identical to said second side.

7. The wire cage of claim 6, wherein a number of second open regions located at a second interface defined by said first side and said third side are defined, in part, by a second vertical wire of said first side and a first vertical wire of said third side, said second vertical wire of said first side being spaced a first distance from said second interface and said first vertical wire of said third side being spaced a second distance from said second interface, said second distance being different from said first distance.

8. The wire cage of claim 7, wherein said first interface defines a substantially ninety degree bend between said first side and said second side and said second interface defines a substantially ninety degree bend between said first side and said third side.

9. The wire cage of claim 8, wherein said first open regions are vertically aligned.

10. The wire cage of claim 8, wherein said second open regions are vertically aligned.

11. The wire cage of claim 8, wherein both said first open regions and said second open regions are respectively vertically aligned.

12. The wire cage of claim 11, wherein said first interface and said second interface are uniformly spaced so that said first open regions at said first interface are substantially parallel to said second open regions at said second interface.

13. The wire cage of claim 7, further comprising one or more cable guiding structures for releasably mounting to the wire cage.

14. The wire cage of claim 13, wherein each of said cable guiding structures cooperate with both said first and second vertical wires of either said second or said third side as well as with one of either said first or said second vertical wires of said first side via said open regions.

15. The wire cage of claim 14, wherein said open regions are uniformly shaped and sized to enable said cable guiding structures to be releasably mounted to the wire cage at different vertical positions thereon.

16. A method of making an elongated wire cage, comprising the steps of:
  (i) forming a first side by connecting at least two first longitudinal wires via a number of lateral wires so that said first longitudinal wires are substantially parallel with respect to each other;
  (ii) forming a second side by connecting at least two second longitudinal wires via at least some of said lateral wires so that said second longitudinal wires are substantially parallel with respect to each other, said at least some lateral wires being bent so as to define a first corner region at the intersection of said second side and said first side;
  (iii) forming a third side by connecting at least two third longitudinal wires via at least some of said lateral wires so that said third longitudinal wires are substantially parallel with respect to each other, said at least some lateral wires being bent so as to define a second corner region at the intersection of said third side and said first side; and
  (iv) providing a series of vertically aligned open regions at each of said first and second corner regions;
  wherein said first longitudinal wires are spaced at a first predefined distance with respect to each other, said second longitudinal wires are spaced at a second predefined distance with respect to each other, and said third longitudinal wires are spaced at a third predefined distance with respect to each other, said first predefined distance being greater than said second and third predefined distances, and said second and third predefined distances being substantially equal;
  said number of lateral wires including a top lateral wire, a bottom lateral wire, and a plurality of intermediate lateral wires; wherein said top lateral wire and said bottom lateral wire are longer than said plurality of intermediate wires.

17. The method of claim 16, wherein said open regions at said first corner region are defined, in part, by one of said first longitudinal wires of said first side and one of said second longitudinal wires of said second side, said first longitudinal wire being spaced a first distance from said first corner region and said second longitudinal wire of said second side being spaced a second distance from said first corner region, said second distance differing from said first distance.

18. The method of claim 17, wherein said open regions at said second corner region are defined, in part, by another of said first longitudinal wires of said first side and one of said third longitudinal wires of said third side, said first longitudinal wire being spaced a first distance from said second corner region and said third longitudinal wire of said third side being spaced a second distance from said second corner region, said second distance differing from said first distance.

* * * * *